(12) United States Patent
Kerkman et al.

(10) Patent No.: US 8,816,729 B2
(45) Date of Patent: Aug. 26, 2014

(54) PHASE-LOCKED-LOOP WITH QUADRATURE TRACKING FILTER FOR SYNCHRONIZING AN ELECTRIC GRID

(75) Inventors: Russel J. Kerkman, Milwaukee, WI (US); Ahmed Mohamed Sayed Ahmed, Mequon, WI (US); Brian J. Seibel, Grafton, WI (US); Carlos Rodriguez Valdez, Glendale, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 13/468,941

(22) Filed: May 10, 2012

(65) Prior Publication Data

US 2013/0120039 A1    May 16, 2013

Related U.S. Application Data

(60) Provisional application No. 61/559,653, filed on Nov. 14, 2011.

(51) Int. Cl.
*H03L 7/06* (2006.01)
(52) U.S. Cl.
USPC ........... 327/156; 327/147; 327/149; 327/152; 327/162
(58) Field of Classification Search
USPC ...................... 327/141, 144–163; 331/15–17; 375/373–376
See application file for complete search history.

(56) References Cited

U.S. PATENT DOCUMENTS

| | | | | |
|---|---|---|---|---|
| 5,388,127 | A * | 2/1995 | Scarpa | 375/376 |
| 7,400,690 | B2 * | 7/2008 | Sun et al. | 375/297 |
| 7,502,602 | B2 * | 3/2009 | Wolf | 455/260 |
| 7,528,666 | B2 * | 5/2009 | Gomez | 331/17 |
| 2005/0231871 | A1 * | 10/2005 | Karimi Ghartemani | 361/86 |
| 2007/0021084 | A1 * | 1/2007 | Wolf | 455/260 |
| 2010/0213925 | A1 * | 8/2010 | Teodorescu et al. | 324/76.78 |

OTHER PUBLICATIONS

Cung,Se-Kyo, A Phase Tracking System for Three Phase Utility Interface Inverters, IEEE Transactions on Power Electronics, vol. 15, No. 3, May 2000.
Rodriguez, P., Decoupled Double Synchronous Reference Frame PLL for Power Converter Control, IEEE Transactions on Power Electronics, vol. 22, No. 2, Mar. 2007.

* cited by examiner

*Primary Examiner* — Brandon S Cole
(74) *Attorney, Agent, or Firm* — Fletcher Yoder, P.C.

(57) ABSTRACT

Methods and systems for synchronizing an electric grid having unbalanced voltages are provided. A voltage vector may be filtered in a quadrature tracking filter (QTF) to generate a quadrature signal. The inputs to the QTF may be either single input, multiple outputs, or alternatively, multiple inputs, multiple outputs. Furthermore, the second state of either of the two QTF transformations may be either positive or negative. A phase-locked-loop (PLL) operation may be performed on the quadrature signal to monitor a voltage vector between the grid and a connected power converter. The QTF and PLL methods are suitable for either single-phase applications or n-phase (any number of phases) applications.

19 Claims, 5 Drawing Sheets

PHASE-LOCKED-LOOP WITH QUADRATURE TRACKING FILTER FOR SYNCHRONIZING AN ELECTRIC GRID

CROSS REFERENCE TO RELATED APPLICATIONS

This application is a Non-Provisional of U.S. Provisional Patent Application No. 61/559,653, entitled "A Phase-Locked-Loop with Quadrature Tracking Filter for Synchronizing an Electric Grid", filed Nov. 14, 2011, which is herein incorporated by reference in its entirety.

BACKGROUND

The invention relates generally to electrical networks, and more specifically, to methods of synchronizing input signals into the electrical networks.

Electric devices may be connected or organized in a network to enable the transmission of power to the devices, or communication between the devices. Such a network of interconnected devices may be described as a grid. For example, an electric grid may be an interconnected network for delivering electricity from one or more power generators to the connected devices (e.g., customers of the utility company). A power grid may transmit AC power at a synchronized frequency, amplitude, and/or phase angle to efficiently connect a large number of power generators and devices. Synchronized operation of a grid, or portions of a grid, may enable a pooling of power generation, as well as a pooling of loads to result in lower operating costs.

The synchronized transmission of AC power may be beneficial for efficiently transmitting and/or distributing of power. However, many factors may disturb the synchronization of a grid. For example, voltage imbalances, angular frequency variations, and voltage harmonic distortions may significantly disturb grid synchronization. In particular, voltage imbalances may be common in a power grid, as single phase loads of a grid may not be evenly distributed between the phases of the supplied power and may be continuously connected and disconnected. Such discrepancies in the amplitudes, frequencies, and/or phase angles between two parallel voltages may cause abnormal current circulation within the grid which may result in a large current imbalance. Imbalanced currents may stress grid devices, such as AC-DC converters, cycloconverters, active filters, induction motors, and other energy storage systems which function to convert and/ or transfer power through the grid to the connected electric devices. Imbalanced current may also stress grid link inductors and capacitors, and imbalanced current in one end device of a grid may introduce a torque ripple through the grid.

Power converters used in single-phase applications such as fundamental front end (FFE) regenerative braking may be even more susceptible to damages or inefficiencies resulting from imbalanced current, as the DC bus voltage ripple may become higher in single-phase applications than in three-phase applications due to the relatively higher input current and high DC bus capacitor ripple in single-phase applications. Furthermore, the drive may not be able to operate properly if the current circulating through the single-phase converter is not controlled.

Conventional methods of synchronizing a grid include using a phase lock loop (PLL) having a standard synchronous reference frame. However, such conventional methods may not be sufficient for alleviating the effects associated with an unbalanced grid, particularly the effects associated with single-phase converter applications. Methods of decreasing the effects of voltage and/or current imbalance in a grid that employs single-phase applications may improve the performance and synchronous operation of the grid.

BRIEF DESCRIPTION

One embodiment relates to a method for synchronizing to an electric grid. The method includes receiving a voltage vector of the electric grid and generating a quadrature signal of the voltage vector using a quadrature tracking filter (QTF). The method also includes performing a phase-locked-loop (PLL) operation on the quadrature signal to determine a phase angle of the voltage vector.

Another embodiment relates to a phase angle generator. The phase angle generator includes a quadrature tracking filter (QTF) configured to receive a voltage measurement and output a quadrature voltage signal based on the voltage measurement. The phase angle generator also includes a phase-locked-loop (PLL) configured to receive the quadrature voltage signal, determine a phase angle of the voltage vector, and output a signal indicative of the determined phase angle of the voltage vector.

In another implementation, a grid synchronizing circuit is provided. The grid synchronizing circuit includes a quadrature tracking filter (QTF) configured to receive a voltage measurement and output a quadrature voltage signal based on the voltage measurement, wherein the voltage measurement is proportional to current drawn from an electric grid by a power converter. The grid synchronizing circuit also includes a phase-locked-loop (PLL) coupled to the QTF. The PLL is configured to receive the quadrature voltage signal and determine an error signal based on the quadrature voltage signal.

DRAWINGS

These and other features, aspects, and advantages of the present invention will become better understood when the following detailed description is read with reference to the accompanying drawings in which like characters represent like parts throughout the drawings, wherein.

Figure 3:
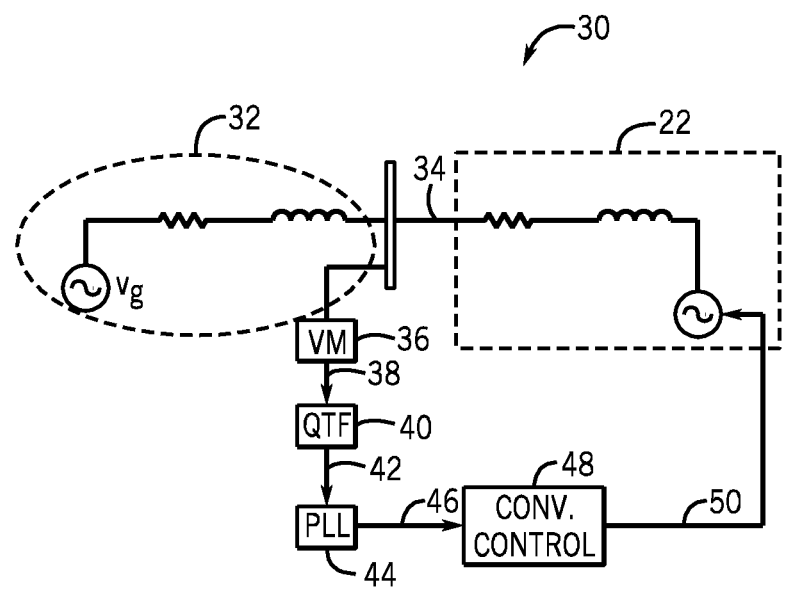
FIG. 3 is a schematic diagram of a grid system using a quadrature tracking filter and a phase-locked loop to monitor the voltage vector of a single-phase converter, in accordance with one embodiment of the present techniques.
Figure 5:
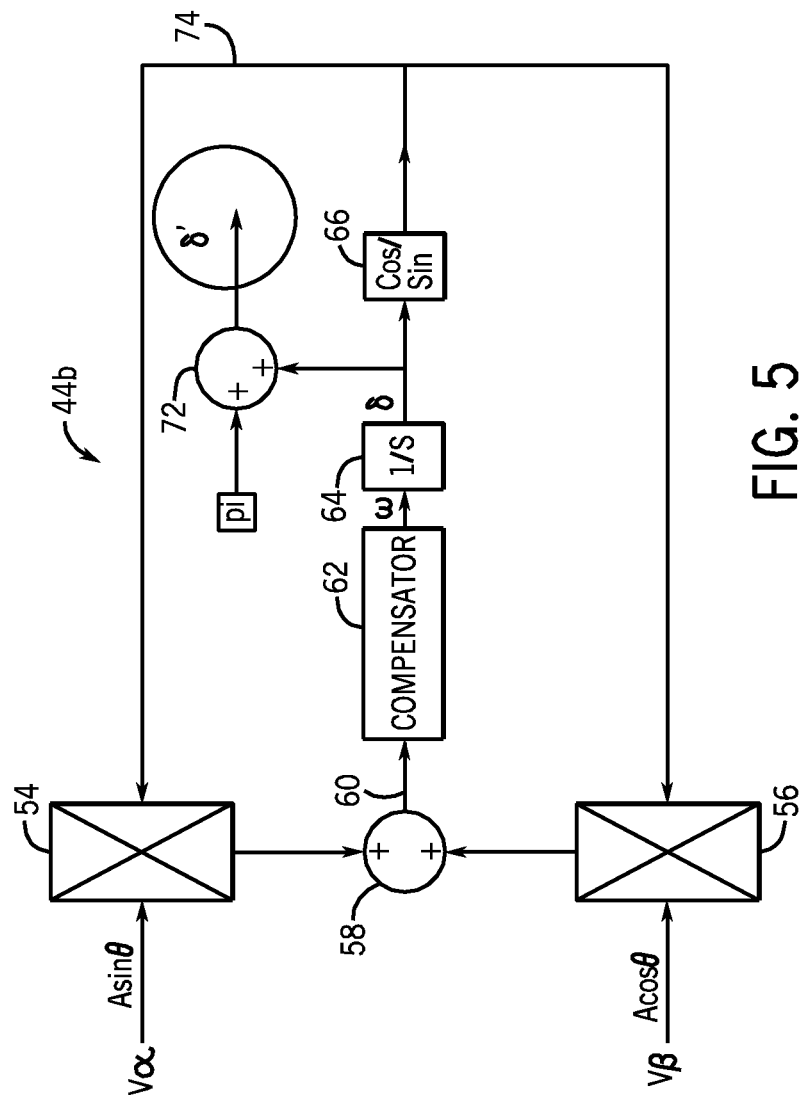
Figure 6:
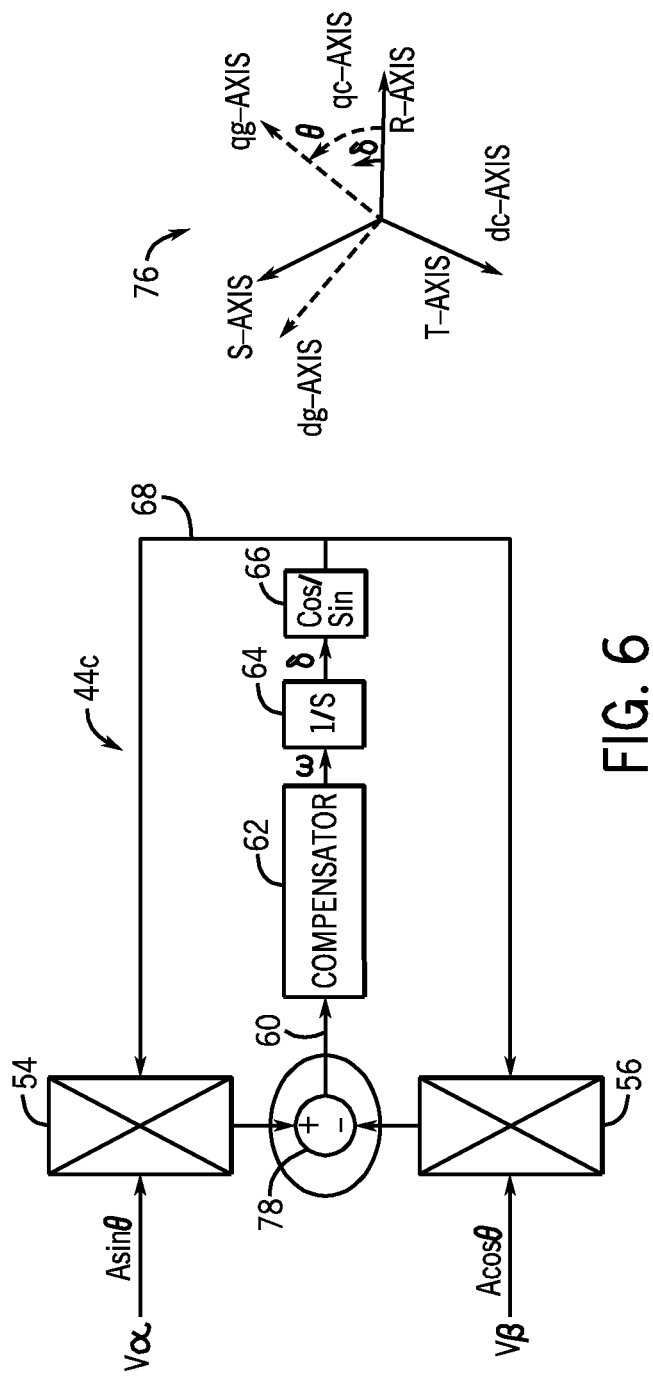

FIG. 5 is a block diagram representing a phase-locked-loop having a correction input which may be used to monitor a voltage vector of a single-phase converter in the grid system, in accordance with one embodiment of the present techniques; and FIG. 6 is a block diagram representing another phase-locked-loop which may be used in the grid system of FIG. 3 for monitoring a voltage vector of a single-phase converter in the grid system, in accordance with one embodiment of the present techniques.

DETAILED DESCRIPTION

An electric grid typically includes a network of loads (e.g., motors, end devices, etc.) which may be interconnected to enable communication between the loads and/or transmission of power to the loads. For example, an industrial grid may include power generators which generate power to be distributed to various motors or other devices powered via the grid. A grid may include alternating current (AC) power sources operating in parallel. Power generated and distributed by various sources (e.g., a power plant, a generator, etc.) may be synchronized in frequency, amplitude, and/or phase angle. Synchronization of AC power may result in the efficient transmission and/or distribution of power.

Figure 1:
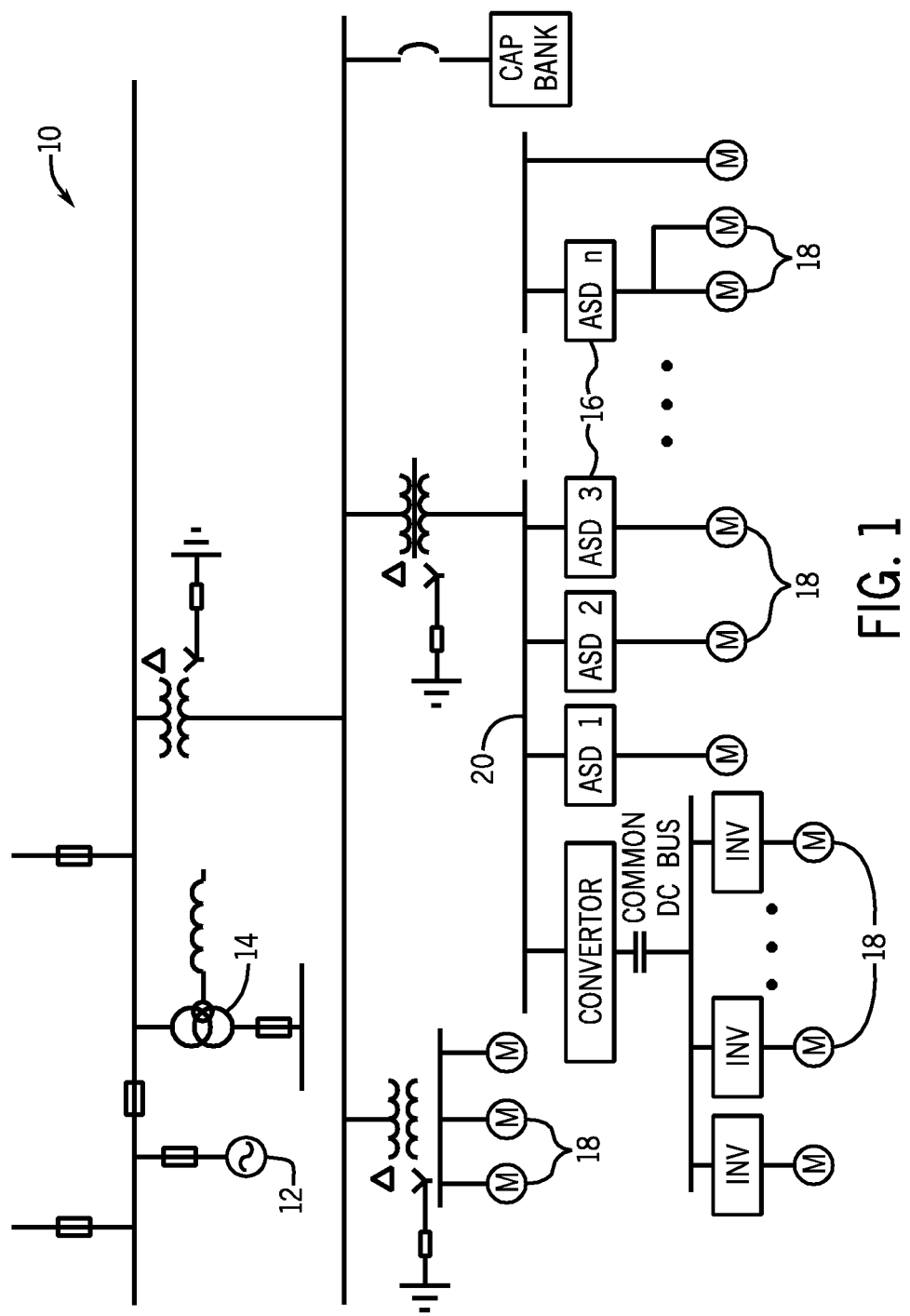
FIG. 1 is a block diagram illustrating a power grid system, in accordance with one embodiment of the present techniques.

One example of an electric grid system 10 may be illustrated in FIG. 1, where a generator 12 may deliver power through the grid system 10 to the motors 18 of different devices. The system 10 may include a transformer 14, which may control voltages used for delivering power. As each device may operate on different speeds, the grid system 10 may also include adjustable speed drives (ASDs) 16 configured to adjust the operating speed of the motors 18 for each device.

A typical electric grid system may not always be balanced, as the loads (e.g., the devices connected to the motors 18) may not be evenly distributed between phases. The connection or disconnection of any motor 18 may also affect the signals distributed by the generator 12 and the three-phase transformer 14. Furthermore, a voltage imbalance at one motor 18 may affect the operation of other motors 18 coupled to the unbalanced motor 18. For example, at the point of common coupling 20, voltage imbalance at a motor 18 coupled to ASD1 may also result in voltage imbalance at a motor 18 coupled to ASD2 or ASD3, as there is no impedance between the motors 18 to prevent the voltage imbalance from propagating through commonly coupled motors 18 of the grid system 10. As discussed, such imbalance (i.e., discrepancies in the amplitudes) of the two coupled voltages may cause a large current imbalance, which may damage both systems.

Furthermore, while a three-phase transformer is represented in the illustrated grid system 10, the present techniques may be suitable for single phase applications or applications having different numbers of phases. Power converters used in single-phase applications may include, for example, fundamental front end (FFE) regenerative braking, photovoltaic systems, or residential systems. Due to the nature of single-phase power converter systems, voltage imbalances in a single-phase converter may be particularly damaging to the grid system. Moreover, single-phase systems may be more difficult to monitor using standard PLL techniques.

Figure 2:
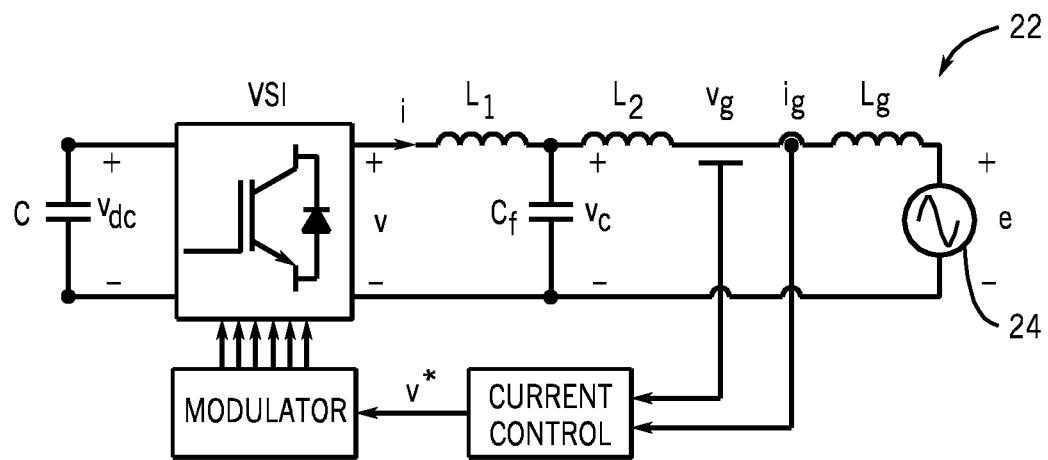
FIG. 2 is a schematic diagram representing a single-phase power converter, in accordance with one embodiment of the present techniques.

An example of a single-phase power converter is illustrated in FIG. 2. In some embodiments, a grid system 10 may be connected to a converter 22 having a single phase power source 24. Typically, a phase-locked loop (PLL) is utilized for controlling phase synchronization of a grid by regulating to zero the difference between the PLL output δ' and the phase δ of two measured inputs A sin δ and A cos δ. However, in single-phase systems, a single-phase voltage vector may not be monitored with sufficient accuracy using a two-input PLL.

In some embodiments, line synchronization system using a quadrature tracking filter (QTF) with a PLL may be suitable for tracking a single-phase system and/or for individually tracking a single phase in a multi-phase system. FIG. 3 is a block diagram of a line synchronization system 30 having a grid 32 connected to a single-phase converter 22. In some embodiments, the converter 22 may draw AC power from the grid 32. The line synchronization system 30 may also include a suitable voltage measurement device 36 which outputs a voltage measurement 38 to the QTF 40. The QTF 40 may output a quadrature voltage set 42 from the single-phase voltage measurement 38, and this quadrature voltage set 42 may be input to the PLL 44, which may output an error signal 46 based on the quadrature voltage set 42. The error signal 46 may be transmitted to a converter controller 48 which may generate a control signal 50 based on the error signal 46 to control operations of the converter 22.

In some embodiments, the QTF 40 may be replaced by a quadrature signal generator using a suitable transformer, such as a Hilbert transformer, or a transport delay block suitable for shifting the phase of the voltage measurement 38 by 90 degrees with respect to the fundamental frequency of the input signal, thereby creating the quadrature voltage set 42. The QTF 40 may generate the quadrature voltage set 42 using any suitable algorithm which may output a multi-phase quadrature voltage. Furthermore, the QTF 40 may generate the quadrature voltage set 42 from a single-phase voltage input, or from an n-phase (any number of phases) voltage input. Equation (1) below represent a single input, multiple output quadrature tracking filter:

$$\begin{bmatrix} \dot{x}_1(t) \\ \dot{x}_2(t) \end{bmatrix} = \begin{bmatrix} -a & -\omega_0 \\ \omega_0 & 0 \end{bmatrix} * \begin{bmatrix} x_1(t) \\ x_2(t) \end{bmatrix} + \begin{bmatrix} a \\ 0 \end{bmatrix} * u(t) \quad \text{equation (1)}$$

Equation (2) represents a multiple input, multiple output quadrature tracking filter:

$$\begin{bmatrix} \dot{x}_1(t) \\ \dot{x}_2(t) \end{bmatrix} = \begin{bmatrix} -a & 0 \\ 0 & 0 \end{bmatrix} * \begin{bmatrix} x_1(t) \\ x_2(t) \end{bmatrix} + \begin{bmatrix} a & -x_1(t) \\ x_2(t) & 0 \end{bmatrix} * \begin{bmatrix} u(t) \\ \omega_0(t) \end{bmatrix} \quad \text{equation (2)}$$

For example, the single input, multiple output quadrature tracking filter represented by equation (1) may be suitable for inputting a frequency of the voltage vector and outputting a quadrature signal having frequency and voltage components. The multiple input, multiple output quadrature tracking filter represented by equation (2) may be suitable for inputting a frequency and a voltage of the voltage vector and outputting a quadrature signal having frequency and voltage components.

Furthermore, in both the single input, multiple output QTF of equation (1) and the multiple input, multiple output QTF of equation (2), two implementations may be used. The two implementations for each of the tracking filters in equations (1) and (2) are represented in equations (3) and (4) below:

$$\begin{bmatrix} y_\alpha(t) \\ y_\beta(t) \end{bmatrix} = \begin{bmatrix} 1 & 0 \\ 0 & 1 \end{bmatrix} * \begin{bmatrix} x_1(t) \\ x_2(t) \end{bmatrix} \quad \text{equation (3)}$$

$$\begin{bmatrix} y_\alpha(t) \\ y_\beta(t) \end{bmatrix} = \begin{bmatrix} 1 & 0 \\ 0 & -1 \end{bmatrix} * \begin{bmatrix} x_1(t) \\ x_2(t) \end{bmatrix} \quad \text{equation (4)}$$

As indicated in equations (3) and (4) above, the sign on the second state is positive in equation (3) and negative in equation (4), as the reference frames used in the transformations may have two different rotations and different possible convergences. In some embodiments, the QTF 40 may store algorithms to perform either single input, multiple output quadrature tracking, or multiple input, multiple output quadrature tracking, depending on the inputs received. In some embodiments, the QTF 40 may include processing components for determining the appropriate algorithms to apply on the voltage measurement 38, or the QTF 40 may include processing components for applying all algorithms on the voltage measurement 38 and determining suitable outputs as the quadrature voltage set 42.

Figure 4:
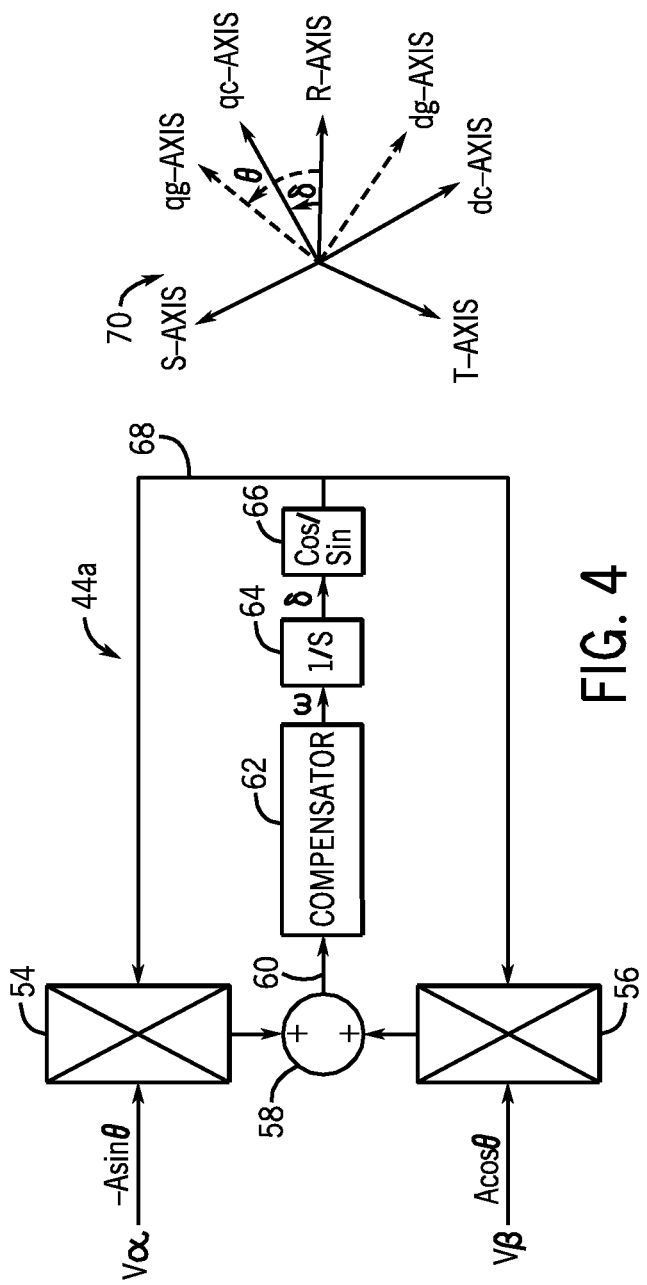
FIG. 4 is a block diagram representing a phase-locked-loop in the grid system of FIG. 3 which may be used to monitor a voltage vector of a single-phase converter in the grid system, in accordance with one embodiment of the present techniques.

As illustrated in FIG. 3, once a quadrature voltage set 42 is generated by a quadrature tracking filter 40, the quadrature voltage set 42 may be input to a phase-locked loop 44. One example of a synchronization technique using a PLL 44a and its corresponding reference frame 70 is represented in FIG. 4. While a grid may supply voltage in three one phase or in any number (n) of phases, the phases may be depicted as having a quadrature voltage input (e.g., $V_\beta$) from the QTF 40 and an internally generated signal (e.g., $V_\alpha$). The two inputs may be in the form of sinusoidal waveforms which are 90° out of phase, rotating in steady state, and at the frequency of the grid voltage.

The instantaneous angular position δ of the equivalent vector to the phase voltages of the grid may be regulated to a feedback loop which regulates the voltage in the d-axis ($V_d$ 60), or the sum of the inputs via adder 58, to the value of the reference signal frequency (e.g., zero in this case). Alternatively, in some embodiments, the feedback loop may regulate the voltage in the q-axis to a reference value of one if a per-unit value is considered. Using the d-axis regulation as an example, the detected d-component of the voltage vector $V_d$ 60 may also be referred to as an error signal. $V_d$ 60 may be transmitted to a compensator 62 which determines a frequency estimate ω of the grid voltage. The frequency estimate ω may then be integrated by an integrator 64 to determine a phase angle estimate δ of the grid voltage. The phase angle δ may be used by another transformation 66 to output a sinusoid and a cosinusoid 68, which may be fed back and multiplied with the original inputs −A sin θ and A cos θ (which is depicted as having an amplitude of 1 after normalization of the gain 68) at the multipliers 54 and 56 to generate, when added, a new error signal $V_d$ 60.

In some embodiments, the QTF 40 and PLL 44 algorithm may be different for different operations of the grid system. For example, in some embodiments, the voltage vector of the converter may be shifted by π after being filtered by a standard QTF and PLL. As illustrated in FIG. 5, in some embodiments, filtering and phase-locking algorithms may include adding π to the phase angle δ at the adder 72 to generate a shifted phase angle δ'. The shifted phase angle δ' may be transformed at the transformer 66 to output a corrected sinusoid and a cosinusoid signal 74 before it is multiplied with the original inputs.

Furthermore, in some embodiments, various transformations may be used to determine the phase angle of the quadrature signal. As illustrated in FIG. 6, the PLL 44c may receive a quadrature voltage input $V_\beta$ from the QTF 40 and an internally generated signal $V_\alpha$ and may subtract the quadrature input $V_\beta$ from the internally generated input $V_\alpha$. The resulting error signal $V_d$ 60 may then be transmitted to the compensator 62 which determines a frequency estimate ω of the grid voltage. The frequency estimate ω may then be integrated by an integrator 64 to determine a phase angle estimate δ of the grid voltage. The phase angle δ may be used by another transformation 66 to output a sinusoid and a cosinusoid 68, which may be fed back and multiplied with the original inputs A sin θ and A cos θ (which is depicted as having an amplitude of 1 after normalization of the gain 68) at the multipliers 54 and 56 to generate, when subtracted, a new error signal $V_d$ 60

The QTF 40 and the PLL 44 of the present techniques may be configured to maintain synchronization with the grid 32 even when voltages are imbalanced. Furthermore, the present techniques are suitable for monitoring a voltage vector of a single-phase power converter. Monitoring the voltage vector of a single phase may enable the grid to operate synchronously, and may also protect devices powered by the grid system 10 from the adverse affects of current unbalance.

The configuration of embodiments of the present techniques of quadrature tracking PLL is not limited to the configurations illustrated in FIGS. 4-6. Other algorithms or transformations may be suitable for monitoring a voltage vector having a single phase. For example, the quadrature set described above may be algebraically combined to form balanced three phase sets. Furthermore, the present techniques may involve additional processing which may be in additional and/or external devices. For example, the compensator 62 may output a phase angle δ to devices external to the PLL 44, or the phase angle δ may be further processed and/or filtered before it is returned to the grid system 10. Further, an integrator may be separate from or coupled to the compensator 62.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for synchronizing an electric grid, comprising:
receiving a voltage vector of the electric grid;
generating a quadrature signal of the voltage vector using a quadrature tracking filter (QTF);
performing a phase-locked-loop (PLL) operation on the quadrature signal to determine a phase angle of the voltage vector, wherein performing the PLL operation on the quadrature signal comprises:
receiving a feedback of the phase angle of the voltage vector of the electric grid;
performing a transformation on the feedback of the phase angle of the voltage vector to generate a transformed value;
deriving an estimated phase voltage frequency of the electric grid based on the transformed value;
deriving an estimated phase angle of the estimated phase voltage frequency of the electric grid based on the transformed value; and
locking on the estimated phase angle; and
synchronizing a power output of a power converter device to the electric grid based on the phase angle.

2. The method of claim 1, wherein receiving the voltage vector of the electric grid comprises measuring the voltage of voltage drawn from the electric grid by a single-phase power converter connected to the electric grid.

3. The method of claim 1, wherein receiving the voltage vector of the electric grid comprises measuring the voltage of voltage drawn from the electric grid by a multi-phase power converter connected to the electric grid.

4. The method of claim 1, wherein generating the quadrature signal using the QTF comprises using a single input, multiple output tracking filter.

5. The method of claim 4, wherein a second state of the single input, multiple output tracking filter is either positive or negative.

6. The method of claim 1, wherein generating the quadrature signal using the QTF comprises using a multiple input, multiple output tracking filter.

7. The method of claim 6, wherein a second state of the multiple input, multiple output tracking filter is either positive or negative.

8. The method of claim 1, comprising receiving the phase angle of the voltage vector at a processor and determining whether a single-phase converter connected to the electric grid is imbalanced, based on the phase angle.

9. The method of claim 8, comprising controlling the current drawn by the single-phase converter from the electric grid, if the single-phase converter is imbalanced.

10. A phase angle generator, comprising:
a quadrature tracking filter (QTF) configured to receive a voltage measurement from an electric grid and output a quadrature voltage signal based on the voltage measurement, wherein the electric grid comprises an interconnected network for delivering electricity from one or more power generators; and
a phase-locked-loop (PLL) configured to
receive the quadrature voltage signal;
receive a feedback of the phase angle of the voltage measurement from the electric grid;
perform a transformation on the feedback of the phase angle of the voltage measurement to generate a transformed value;
derive an estimated phase voltage frequency of the electric grid based on the transformed value;
derive an estimated phase angle of the estimated phase voltage frequency of the electric grid based on the transformed value;
lock on the estimated phase angle; and
output a signal indicative of the estimated phase angle of the voltage measurement.

11. The phase angle generator of claim 10, wherein the PLL is configured to receive a first input comprising the quadrature voltage signal and a second input comprising a reference voltage signal.

12. The phase angle generator of claim 10, wherein the PLL comprises a compensator configured to estimate the estimated phase voltage frequency of the voltage measurement.

13. The phase angle generator of claim 10, wherein the PLL comprises an integrator configured to determine the estimated phase angle of the voltage measurement based on the estimated phase voltage frequency of the voltage measurement.

14. A grid synchronizing circuit, comprising:
a quadrature tracking filter (QTF) configured to receive a voltage measurement and output a quadrature voltage signal based on the voltage measurement, wherein the voltage measurement is proportional to current drawn from an electric grid by a power converter;
a phase-locked-loop (PLL) coupled to the QTF, wherein the PLL is configured to receive the quadrature voltage signal and determine an error signal based on the quadrature voltage signal; and
current controlling circuitry coupled to the PLL, wherein the current controlling circuitry is configured to receive the error signal and control an operation of the power converter connected in a grid system based on the error signal.

15. The grid synchronizing circuit of claim 14, wherein the QTF comprises a single input, multiple output quadrature tracking filter.

16. The grid synchronizing circuit of claim 15, wherein a second state of the single input, multiple output quadrature tracking filter is either positive or negative.

17. The grid synchronizing circuit of claim 14, wherein the QTF comprises a multiple input, multiple output quadrature tracking filter.

18. The grid synchronizing circuit of claim 17, wherein a second state of the multiple input, multiple output quadrature tracking filter is either positive or negative.

19. The grid synchronizing circuit of claim 14, wherein the power converter is configured to synchronize a power output by the power converter to the electric grid.

* * * * *